United States Patent
Koide

(10) Patent No.: US 7,262,988 B2
(45) Date of Patent: Aug. 28, 2007

(54) MEMORY DEVICE AND SEMICONDUCTOR DEVICE

(75) Inventor: Yasunori Koide, Matsumoto (JP)

(73) Assignee: Seiko Epson Corporation (JP)

( * ) Notice: Subject to any disclaimer, the term of this patent is extended or adjusted under 35 U.S.C. 154(b) by 9 days.

(21) Appl. No.: 11/287,059

(22) Filed: Nov. 23, 2005

(65) Prior Publication Data

US 2006/0146591 A1    Jul. 6, 2006

(30) Foreign Application Priority Data

Jan. 6, 2005    (JP) ............................. 2005-001219

(51) Int. Cl.
G11C 11/00    (2006.01)
G11C 11/22    (2006.01)

(52) U.S. Cl. .................................. 365/154; 365/145

(58) Field of Classification Search ................ 365/154, 365/145, 230.05, 156
See application file for complete search history.

(56) References Cited

U.S. PATENT DOCUMENTS 6,512,687 B1 *    1/2003    Chen et al. ................. 365/145
6,646,909 B2 *    11/2003    Miwa et al. ................. 365/154
6,707,702 B1 *    3/2004    Komatsuzaki .............. 365/145
6,836,428 B2 *    12/2004    Nakura et al. .............. 365/154
6,996,000 B2 *    2/2006    Chen et al. .................. 365/154

FOREIGN PATENT DOCUMENTS

JP    64-066899    3/1989

* cited by examiner

*Primary Examiner*—Anh Phung
(74) *Attorney, Agent, or Firm*—Harness, Dickey & Pierce, P.L.C.

(57) ABSTRACT

A memory circuit includes a latch circuit having a first inverter and a second inverter, a first ferroelectric capacitor that gives a first capacitance to a power supply terminal of the first inverter, a second ferroelectric capacitor that gives a second capacitance different from the first capacitance to a power supply terminal of the second inverter, and a voltage source that starts supplying a drive voltage for driving the latch circuit to the power supply terminal of the first inverter to which the first capacitance is given and the power supply terminal of the second inverter to which the second capacitance is given.

11 Claims, 5 Drawing Sheets

MEMORY DEVICE AND SEMICONDUCTOR DEVICE

The entire disclosure of Japanese Patent Application No. 2005-001219, filed Jan. 6, 2005 is expressly incorporated by reference herein.

BACKGROUND

1. Technical Field

The present invention relates to memory devices and semiconductor devices. In particular, the present invention relates to memory circuits that can readily read stored data, and semiconductor devices equipped with the memory circuits.

2. Related Art

JP-A-64-66899 describes a memory cell that is equipped with a static cell having two internal nodes and a nonvolatile section having two ferroelectric capacitors. When a voltage that inverts the polarity of the ferroelectric capacitors is applied to the ferroelectric capacitors, the voltage at one of the internal nodes becomes slightly higher than the voltage at the other internal node. As a result, data is transferred from the nonvolatile section to the static cell.

However, when data is transferred from the nonvolatile section to the static cell in the memory cell described above, the bit line needs to be pre-charged, and further the voltage needs to be applied to the ferroelectric capacitors, which causes a problem in that the operations become complex. When the memory cell is used in a program circuit, data must be determined immediately after the power turns on, and therefore a circuit for detecting the power-on and a control circuit for performing the operations are required. Moreover, because a control signal is generated for the operations after detecting the power-on, it takes some time for determining data. Also, in the memory cell described above, although the voltage at one of the internal nodes becomes higher than the voltage at the other internal node, their voltage difference is very small, which causes a problem in that the static cell may malfunction when manufacturing differences are present in the threshold voltages of transistors that compose the static cell.

SUMMARY

In accordance with an advantage of some aspects of the present invention, memory circuits and semiconductor devices that can solve the problems described above are provided. This advantage is achieved by a combination of characteristics recited in each independent claim, and dependent claims further define concrete examples of other advantageous aspects of the invention.

In accordance with an aspect of a first embodiment of the invention, a memory circuit includes a latch circuit having a first inverter and a second inverter, a first ferroelectric capacitor that gives a first capacitance to a power supply terminal of the first inverter, a second ferroelectric capacitor that gives a second capacitance different from the first capacitance to a power supply terminal of the second inverter, and a voltage source that starts supplying a drive voltage for driving the latch circuit to the power supply terminal of the first inverter to which the first capacitance is given and the power supply terminal of the second inverter to which the second capacitance is given.

With the structure described above, when the drive voltage is supplied to the latch circuit, in other words, when the memory circuit is powered on, potentials on the power supply terminal of the first inverter and the power supply terminal of the second inverter rise according to the first capacitance and the second capacitance, respectively. In other words, the voltage on each of the power supply terminals rises according to a capacitance determined based on the paraelectric characteristic of each of the first ferroelectric capacitor and the second ferroelectric capacitor, respectively. Accordingly, with the structure described above, the rising rates of output voltages of the first inverter and the second inverter are determined by the first capacitance and the second capacitance, respectively, such that the memory circuit can read data stored in the first ferroelectric capacitor and the second ferroelectric capacitor onto the latch circuit only by powering on the memory circuit.

The memory circuit may preferably be further equipped with a resistance element provided between the power supply terminal of the first inverter and the power supply terminal of the second inverter.

According to the structure described above, the power supply terminal of the first inverter and the power supply terminal of the second inverter as well as the first ferroelectric capacitor and the second ferroelectric capacitor connected thereto are charged through the resistance element. Therefore, according to the structure described above, the difference in charging rates can be made much greater, such that data stored in the first ferroelectric capacitor and the second ferroelectric capacitor can be stably read onto the latch circuit.

In the memory circuit described above, the resistance element may preferably be a p-type MOS transistor. Also, the p-type MOS transistor may preferably have a sufficiently small drivability, and a sufficiently large resistance component. The p-type MOS transistor may have a smaller drivability and a greater resistance component compared to other p-type MOS transistors in a semiconductor device having the memory circuit incorporated therein.

In the memory circuit described above, the first ferroelectric capacitor may store first data, and the second ferroelectric capacitor may store second data complementary to the first data. The memory circuit may preferably be further equipped with a rewriting circuit that, when the voltage source supplies the drive voltage to the power supply terminal of the first inverter and the power supply terminal of the second inverter, stores the second data in the second ferroelectric capacitor based on an output of the first inverter and the first data in the first ferroelectric capacitor based on an output of the second inverter.

Also, in the memory circuit described above, each of the first ferroelectric capacitor and the second ferroelectric capacitor has one end and another end, and the rewriting circuit may have a first p-type MOS transistor having a source connected to the voltage source and a drain connected to the power supply terminal of the first inverter and to the one end of the first ferroelectric capacitor, and a second p-type MOS transistor having a source connected to the voltage source and a drain connected to the power supply terminal of the second inverter and to the one end of the second ferroelectric capacitor, wherein, based on an output of the second inverter, a ground voltage or the output of the second inverter may preferably be supplied to a gate of the first p-type MOS transistor and the other end of the first ferroelectric capacitor, and based on an output of the first inverter, a ground voltage or the output of the first inverter may preferably be supplied to a gate of the second p-type MOS transistor and the other end of the second ferroelectric capacitor.

Further, in the memory circuit described above, the rewriting circuit may preferably have a first n-type MOS transistor having a source grounded, a drain connected to the power supply terminal of the first inverter and to the one end of the first ferroelectric capacitor and a gate connected to the other end of the first ferroelectric capacitor, and a second n-type MOS transistor having a source grounded, a drain connected to the power supply terminal of the second inverter and to the one end of the second ferroelectric capacitor and a gate connected to the other end of the second ferroelectric capacitor.

Also, in the memory circuit described above, the rewriting circuit may preferably be further equipped with a first transfer gate provided between an output terminal of the second inverter and the other end of the first ferroelectric capacitor and the gate of the first p-type MOS transistor, and a second transfer gate provided between an output terminal of the first inverter and the other end of the second ferroelectric capacitor and the gate of the second p-type MOS transistor.

With the structure described above, the rewriting circuit rewrites data in the first ferroelectric capacitor and the second ferroelectric capacitor based on data retained by the latch circuit. Also, with the structure described above, the rewriting circuit performs a rewriting operation according to the timing at which the voltage source supplies a drive voltage to the power supply terminals. Therefore, the structure described above makes it possible to provide a memory circuit that can rewrite data in the first ferroelectric capacitor and the second ferroelectric capacitor with a very simple structure.

The memory circuit described above may preferably be further equipped with a voltage detecting section that, when the voltage value of the drive voltage exceeds a specified value, turns on the first transfer gate and the second transfer gate to thereby supply an output of the first inverter to the other end of the second ferroelectric capacitor and to the gate of the second p-type MOS transistor, and supply an output of the second inverter to the other end of the first ferroelectric capacitor and to the gate of the first p-type MOS transistor.

Further, in the memory circuit described above, the rewriting circuit may preferably have a third n-type MOS transistor having a source grounded and a drain connected to the other end of the first ferroelectric capacitor, and a fourth n-type MOS transistor having a source grounded and a drain connected to the other end of the second ferroelectric capacitor, wherein the voltage detecting section may preferably turn on the third n-type MOS transistor and the fourth n-type MOS transistor and turn off the first transfer gate and the second transfer gate when the voltage value of the drive voltage is lower than a specified value, and may preferably turn off the third n-type MOS transistor and the fourth n-type MOS transistor when the voltage value of the drive voltage exceeds a specified value.

According to the structure described above, only by starting the power on, voltages to be applied to the first ferroelectric capacitor and the second ferroelectric capacitor are controlled, and a rewriting operation can be performed.

In the memory device described above, the voltage detecting section may preferably have a third inverter, a third ferroelectric capacitor that gives a third capacitance greater than the first capacitance and the second capacitance to an input terminal of the third inverter, and a resistance element that is provided between the voltage source and the input terminal of the third inverter and has a resistance value that is generally the same as or greater than a resistance value of the first p-type MOS transistor and the second p-type MOS transistor.

With the structure described above, a power supply voltage detecting circuit dedicated to the memory circuit can be provided with a very simple structure. Furthermore, among the power supply voltage detecting circuits that have been used for semiconductor integrated circuits, many of them detect a power supply voltage when it reaches a voltage level close to H logical. However, according to the structure described above, a detection signal can be outputted immediately after a readout operation is completed in the memory circuit, such that a higher speed operation can be achieved, and destruction of data can be prevented.

In accordance with a second embodiment of the invention, a semiconductor device is equipped with the memory circuit described above. It is noted here that the semiconductor device may be any one of devices in general that are equipped with the memory circuit in accordance with the invention and formed from semiconductor without any limitation in its structure, and includes any devices equipped with the memory circuit described above, such as, for example, ferroelectric memory devices, DRAMs, flash memories, and other memory devices that require memory circuits.

DESCRIPTION OF EXEMPLARY EMBODIMENTS

Preferred embodiments of the invention are described below with reference to the accompanying drawings. However, the embodiments below do not in any manner limit the invention concerning the scope of the claimed invention, and not all combinations of the characteristics described in the embodiments are necessarily indispensable to the solutions provided by the invention.

Figure 1:
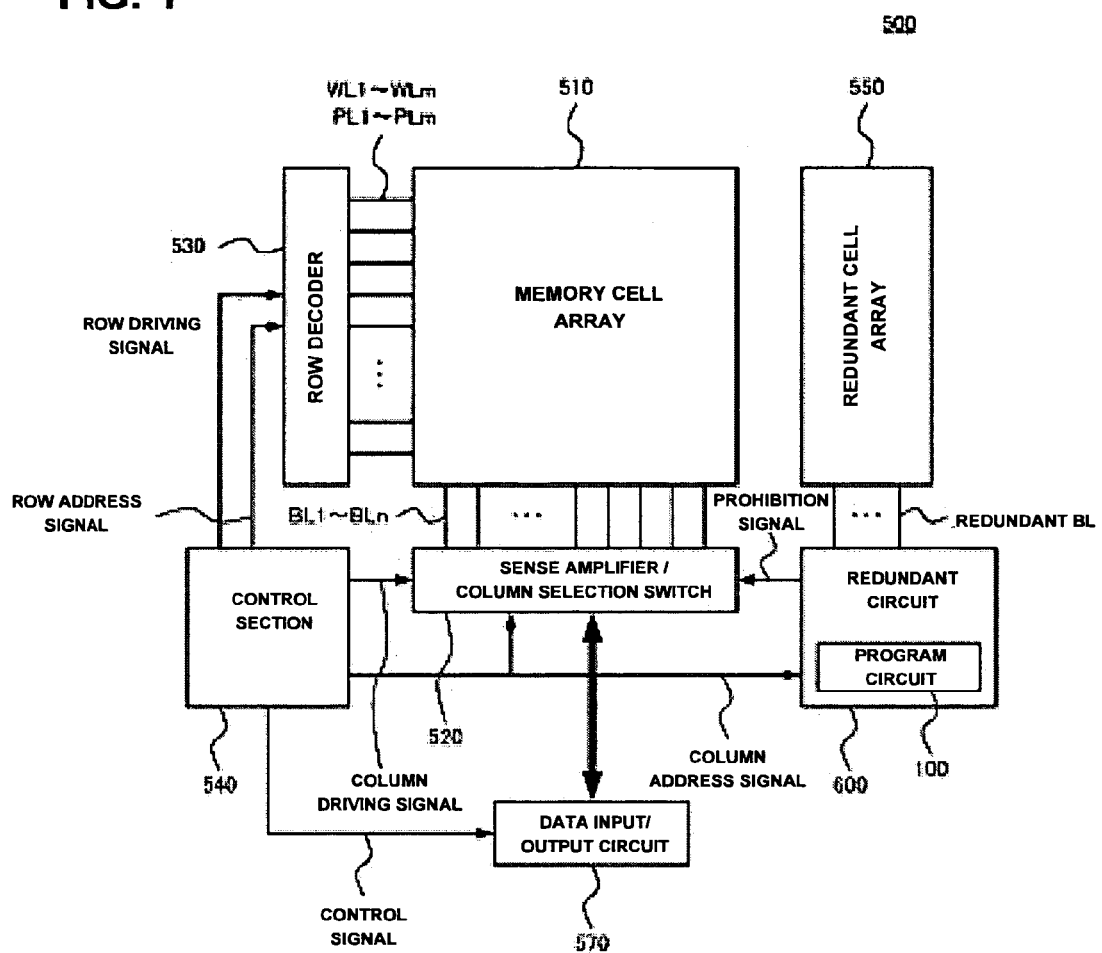
FIG. 1 is a diagram showing the structure of a ferroelectric memory device 500, which is an example of a semiconductor device in accordance with an embodiment of the invention.

FIG. 1 is a diagram showing the structure of a ferroelectric memory device 500, which is an example of a semiconductor device in accordance with an embodiment of the invention. The ferroelectric memory device 500 is equipped with a memory cell array 510, a column decoder and sense amplifier/column selection switch 520, a row decoder 530, a control section 540, a redundant cell array 550, a data input/output circuit 570, and a redundant circuit 600.

The memory cell array 510 is composed of a plurality of ferroelectric capacitors arranged in an array configuration. Each of the ferroelectric capacitors is controlled by one of word lines WL and one of plate lines PL among word lines WL1-WLm (m is an integer of 2 or more), plate lines PL1-PLm, and bit lines BL1-BLn (n is an integer of 2 or more), and one of the bit lines BL outputs data. More concretely, by controlling potentials on the word line WL and the plate line PL, data written in the corresponding ferroelectric capacitor is read out onto the bit line BL. Also, by controlling the potential on the bit line BL, data is written in the corresponding ferroelectric capacitor.

The control section 540 generally controls operations of the ferroelectric memory device 500. More concretely, the control section 540 supplies row address signals and row driving signals to the row decoder 530, and column address signals and column driving signals to the column decoder 520, to read data from the ferroelectric capacitors and write data in the ferroelectric capacitors. Also, the control section 540 supplies column address signals to the redundant circuit 600. The control section 540 also supplies control signals to the data input/output circuit to switch between input and output of data. Also, the control section 540 generates a driving voltage for driving the ferroelectric memory device 500, and supplies the control voltage to various sections including the program circuit 100.

The row decoder 530 controls potentials on the word lines WL1-WLm and the plate lines PL1-PLm. More concretely, the row decoder 530 receives a row address signal from the control section 540, and selects a specified word line WLj (j is an integer of 1 through m), based on the row address signal. Further, a plate line PLj selected by the row decoder 530 is driven by a plate line driving signal at a specified timing. The column decoder and the column selection switch 520 controls connection of the bit lines BL1-BLn to the bus. More concretely, the column decoder 520 receives a column address signal from the control section 540 to control the column selection switch, and connects a specified bit line BLk (k is an integer of 1 through n) to the bus based on the column address signal to thereby transfer data to the data input/output circuit 570. By this, charge is read from a row of ferroelectric capacitors selected by the word line WLj and the plate line PLj that are selected by the row decoder 530 onto each of the bit lines BL1-BLn, and the bit line BLk selected by the column decoder 520 connects to the bus, such that data is outputted from the data input/output circuit 570. At the time of a write operation, data inputted in the data input/output circuit 570 from outside passes through the bus and controls the potential on a selected bit line BLk whereby the data written in a specified ferroelectric capacitor. The bit line BLk selected by the column decoder is not limited to one bit, but it depends on a data width. For example, in the case of an 8-bit data width, eight bit lines BLk are selected.

The redundant circuit 600 includes a plurality of program circuits 100, each of which is an example of a memory circuit. When defect column information programmed by the program circuit 100 and a column address signal inputted by the control section 540 match each other, the redundant circuit 600 generates a prohibition signal and supplies the prohibition signal to the column decoder 520, to prohibit access to a specified bit line BLk programmed. At the same time, the redundant circuit 600 selects a redundant bit line BL in the redundant cell array 550. In other words, the redundant circuit 600 replaces the bit line BLk whose access is prohibited with the redundant bit line.

Figure 2:
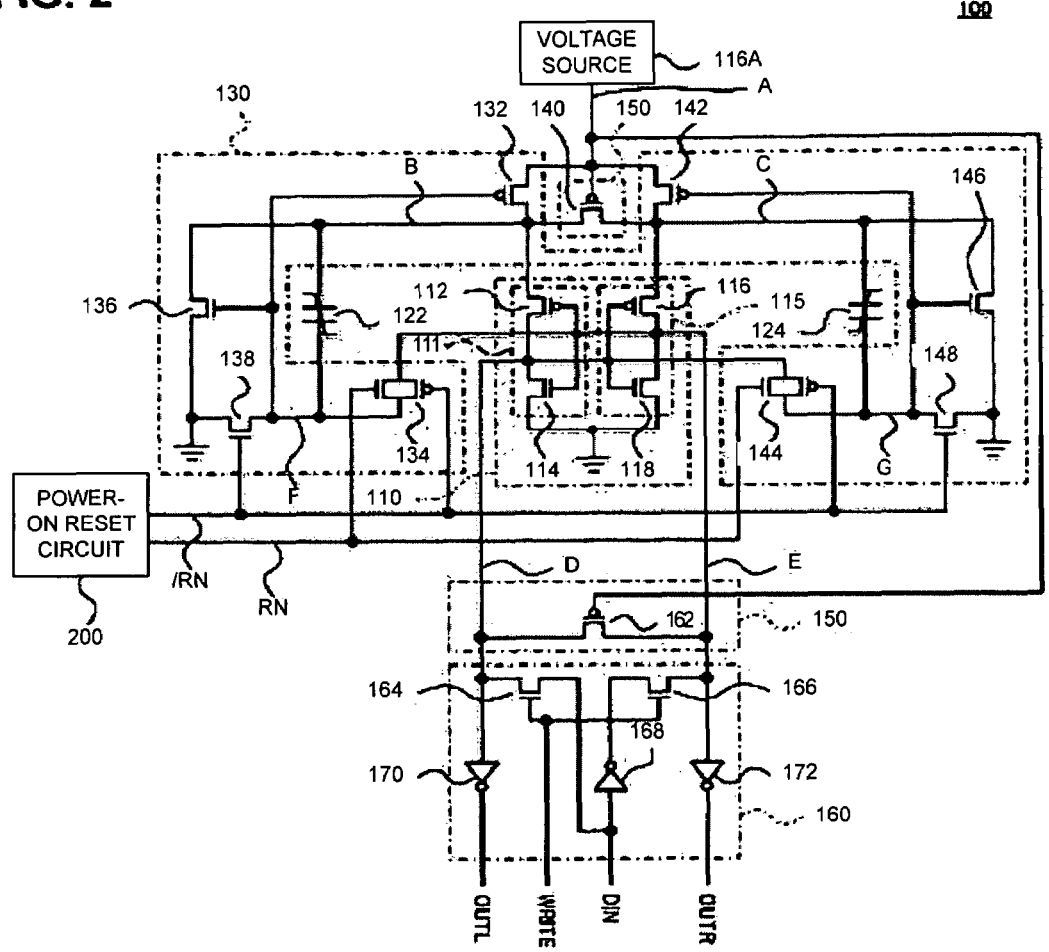
FIG. 2 is a diagram showing an example of the structure of a program circuit 100.

FIG. 2 is a diagram showing an example of the structure of the program circuit 100. The program circuit 100 includes a latch circuit 110, a voltage source 116A, a first ferroelectric capacitor 122 and a second ferroelectric capacitor 124, a rewriting circuit 130, a short-circuiting circuit 150, and a data input/output circuit 160. In accordance with the present embodiment, the program circuit 100 retains specified data in the latch circuit 110, based on data stored in the first ferroelectric capacitor 122 and the second ferroelectric capacitor 124, when the power is turned on.

The latch circuit 110 is formed from a first inverter 111 composed of a p-type MOS transistor 112 and an n-type MOS transistor 114, and a second inverter 115 composed of a p-type MOS transistor 116 and an n-type MOS transistor 118.

The p-type MOS transistor 112 is structured to have a drain connected to a drain of the n-type MOS transistor 114 and an output (node D) of the first inverter 111, a gate connected to a gate of the n-type MOS transistor 114 and an output (node E) of the second inverter 115, and a source to which a drive voltage VCC can be supplied from the voltage source 116A through a p-type MOS transistor 132. Also, the n-type MOS transistor 114 has a source grounded. In other words, the p-type MOS transistor 112 and the n-type MOS transistor 114 supply one of the drive voltage VCC and the ground voltage to the node D and the gates of the p-type MOS transistor 116 and the n-type MOS transistor 118. The substrate potential of the p-type MOS transistor 112 may preferably be generally the same as the potential on one end (in other words, node B) of the first ferroelectric capacitor 122.

The p-type MOS transistor 116 is structured to have a drain connected to a drain of the n-type MOS transistor 118 and the node E, a gate connected to a gate of the n-type MOS transistor 118 and the node D, and a source to which a drive voltage VCC can be supplied from the voltage source 116A through a p-type MOS transistor 142. The n-type MOS transistor 118 has a source grounded. In other words, the p-type MOS transistor 116 and the n-type MOS transistor 118 supply one of the drive voltage VCC and the ground voltage to the node E and the gates of the p-type MOS transistor 112 and the n-type MOS transistor 114. The substrate potential of the p-type MOS transistor 116 may preferably be about the same as the potential on one end (in other words, node C) of the second ferroelectric capacitor 124.

In other words, when the drive voltage VCC is supplied from the voltage source 116A to the sources of the p-type MOS transistors 112 and 116, the latch circuit 110 fixes the nodes D and E to the drive voltage VCC or the ground voltage to retain specified data, according to the voltage value of the drive voltage VCC at each of the sources, respectively.

The rewriting circuit 130 is formed from p-type MOS transistors 132 and 142, transfer gates 134 and 144, and n-type MOS transistors 136 and 146. The rewriting circuit 130 writes data in the first ferroelectric capacitor 122 and the second ferroelectric capacitor 124 based on data retained at the latch circuit 110.

Further, the p-type MOS transistor 132 has a gate connected to the node E through the transfer gate 134, and the p-type MOS transistor 142 has a gate connected to the node D through the transfer gate 144. In other words, the p-type MOS transistor 132 controls, based on the voltage value on the output (node E) of the second inverter 115, as to whether the drive voltage VCC is to be supplied to the source of the p-type MOS transistor 112 composing the first inverter 111. Also, the p-type MOS transistor 142 controls, based on the voltage value on the output (node D) of the first inverter 111, as to whether the drive voltage VCC is to be supplied to the source of the p-type MOS transistor 116 composing the second inverter 115.

The transfer gate 134 switches, base on signal RW and /RW, as to whether or not the gate of the p-type MOS transistor 132, the gate of the n-type MOS transistor 136 and the other end of the first ferroelectric capacitor 122 are to be connected to the output (node E) of the second inverter 115. Also, the transfer gate 144 switches, base on signal RW and /RW, as to whether or not the gate of the p-type MOS transistor 142, the gate of the n-type MOS transistor 146 and the other end of the second ferroelectric capacitor 124 are to be connected to the output (node D) of the first inverter 111.

The n-type MOS transistor 136 has a source grounded, and a drain connected to the source of the p-type MOS transistor 112 and the one end of the first ferroelectric capacitor 122. Also, the n-type MOS transistor 136 has a gate connected to the gate of the p-type MOS transistor 132 and the output (node E) of the second inverter 115 through the transfer gate 134. In other words, the n-type MOS transistor 136 switches, based on the voltage at the output of the second inverter 115, as to whether or not the source of the p-type MOS transistor 112 and the one end of the first ferroelectric capacitor 122 are to be grounded.

The n-type MOS transistor 146 has a source grounded, and a drain connected to the source of the p-type MOS transistor 116 and the one end of the second ferroelectric capacitor 124. Also, the n-type MOS transistor 146 has a gate connected to the gate of the p-type MOS transistor 142 and the output (node D) of the first inverter 111 through the transfer gate 144. In other words, the n-type MOS transistor 146 switches, based on the voltage at the output of the first inverter 111, as to whether or not the source of the p-type MOS transistor 116 and the one end of the second ferroelectric capacitor 124 are to be grounded.

The n-type MOS transistor 138 has a source grounded, and a drain connected to the gate of the p-type MOS transistor 132, the gate of the n-type MOS transistor 136 and the other end of the first ferroelectric capacitor 122. Also, the n-type MOS transistor 138 has a gate to which a signal /RW is supplied. In other words, the n-type MOS transistor 138 switches, based on the signal /RW, as to whether or not the gate of the p-type MOS transistor 132, the gate of the n-type MOS transistor 136 and the other end of the first ferroelectric capacitor 122 are to be grounded.

The n-type MOS transistor 148 has a source grounded, and a drain connected to the gate of the p-type MOS transistor 142, the gate of the n-type MOS transistor 146 and the other end of the second ferroelectric capacitor 124. Also, the n-type MOS transistor 148 has a gate to which a signal /RW is supplied. In other words, the n-type MOS transistor 148 switches, based on the signal /RW, as to whether or not the gate of the p-type MOS transistor 142, the gate of the n-type MOS transistor 146 and the other end of the second ferroelectric capacitor 124 are to be grounded.

The power-on reset circuit 200 generates signals RW and /RW for controlling operations of the rewriting circuit 130 based on the voltage value of the drive voltage VCC generated by the voltage source 116A. The power-on reset circuit 200 in accordance with the present example is structured to set the signal RW to H logical and the signal /RW to L logical, when the drive voltage VCC generated by the voltage source 116A reaches about a voltage indicating H logical.

The first ferroelectric capacitor 122 has one end and another end, and the one end thereof is connected to the source of the p-type MOS transistor 112, which is a power supply terminal of the first inverter 111. The first ferroelectric capacitor 122 gives a capacitance according to data stored therein to the source of the p-type MOS transistor 112.

Also, the one end of the first ferroelectric capacitor 122 is connected to the drain of the n-type MOS transistor 136 and the drain of the p-type MOS transistor 132. Also, the gates of the n-type MOS transistor 136 and the p-type MOS transistor 132 are connected to the other end of the first ferroelectric capacitor 122.

The other end of the first ferroelectric capacitor 122 is connected to the drain of the n-type MOS transistor 138 whose source is grounded, and to the other end of the transfer gate 134 whose one end is connected to the output of the second inverter 115. The n-type MOS transistor 138 and the transfer gate 134 are controlled by signals RW and /RW that are generated by the power-on reset circuit 200. In other words, the other end of the first ferroelectric capacitor 122 is either grounded through the n-type MOS transistor 138 or connected to the output of the second inverter 115 through the transfer gate 134, according to the logical values of the signals RW and /RW.

More specifically, at the time of a readout operation, the n-type MOS transistor 138 turns on, and the voltage on the other end of the first ferroelectric capacitor 122 becomes to be the ground voltage, such that the first ferroelectric capacitor 122 influences as a capacitance for the voltage source to charge the source potential of the p-type MOS transistor 112. When the readout operation ends and the RW signal from the power-on reset circuit changes to H logical, the transfer gate 134 turns on and at the same time the n-type MOS transistor 138 turns off, such that a rewriting operation starts. Then, when the output of the inverter 115 is L logical, the voltage on the other end of the first ferroelectric capacitor 122 becomes to be the ground potential, the n-type MOS transistor 136 turns off, and the p-type MOS transistor 132 turns on, such that an operation voltage VCC is supplied to the one end of the first ferroelectric capacitor 122. Accordingly, a voltage −VCC is applied to the first ferroelectric capacitor 122 with the one end thereof as reference, and data "0" is written therein.

On the other hand, when the output of the inverter 115 is H logical at the time of a readout operation, the voltage on the other end of the first ferroelectric capacitor 122 becomes to be the drive voltage VCC, the n-type MOS transistor 136 turns on, and the p-type MOS transistor 132 turns off, such that a ground voltage is supplied to the one end of the first ferroelectric capacitor 122. Accordingly, a voltage −VCC is applied to the first ferroelectric capacitor 122 with the one end thereof as reference, and data "1" is written therein.

The second ferroelectric capacitor 124 has one end and another end, and the one end thereof is connected to the source of the p-type MOS transistor 116, which is a power supply terminal of the second inverter 115. Then, the second ferroelectric capacitor 124 gives a capacitance according to data stored therein to the source of the p-type MOS transistor 116.

Also, the one end of the second ferroelectric capacitor 124 is connected to the drain of the n-type MOS transistor 146 and the drain of the p-type MOS transistor 142. Also, the gates of the n-type MOS transistor 146 and the p-type MOS transistor 142 are connected to the other end of the second ferroelectric capacitor 124.

The other end of the second ferroelectric capacitor 124 is connected to the drain of the n-type MOS transistor 148 whose source is grounded, and to the other end of the transfer gate 144 whose one end is connected to the output of the first inverter 111. The n-type MOS transistor 148 and the transfer gate 144 are controlled by signals RW and /RW that are generated by the power-on reset circuit 200. In other words, the other end of the second ferroelectric capacitor 124 is either grounded through the n-type MOS transistor 148 or connected to the output of the first inverter 111 through the transfer gate 144, according to the logical values of the signals RW and /RW.

The short-circuiting circuit 150 has a p-type MOS transistor 140 and a p-type MOS transistor 162. The p-type MOS transistor 140 has a source and a drain connected to the sources of the p-type MOS transistors 112 and 116, respectively, and a gate connected to the voltage source 116A. In other words, the p-type MOS transistor 140, before driving by the voltage source 116A, short-circuits the source of the p-type MOS transistor 112 and the source of the p-type MOS transistor 116, and the short-circuited state is released when the drive voltage VCC exceeds the threshold value of the p-type MOS transistor 140.

The p-type MOS transistor 162 has a source and a drain connected to the output (node D) of the first inverter 111 and the output (node E) of the second inverter 115, respectively, and a gate connected to the voltage source 116A. In other words, the p-type MOS transistor 162, before driving by the voltage source 116A, short-circuits the node D and the node E, and the short-circuited state is released when the drive voltage VCC exceeds the threshold value of the p-type MOS transistor 140. Therefore, before driving by the voltage source, data can be stably read in the state in which each of the nodes is reset.

The data input/output circuit 160 is formed from n-type MOS transistors 164 and 166, and inverters 168, 170 and 172. The data input/output circuit 160 outputs data retained by the latch circuit 110 as output signals OUTL and OUTR to outside, and receives data to be retained by the latch circuit 110.

The n-type MOS transistor 164 switches, based on a signal WRITE, as to whether or not a signal DIN is to be supplied to the node D. Also, the n-type MOS transistor 166 switches, based on the signal WRITE, as to whether or not a signal obtained by inverting the signal DIN by the inverter 168 is to be supplied to the node E. In other words, when the signal WRITE indicates H logical, a voltage close to the drive voltage is applied to one of the nodes D and E, based on the signal DIN, and the ground voltage is supplied to the other end. By this, the voltages on the input and the output of the first inverter 111 and the second inverter 115 that compose the latch circuit 110 are fixed, such that the latch circuit 110 retains data based on the signal DIN.

The inverters 170 and 172 are connected to the output of the first inverter 111 and the output of the second inverter 115, respectively. Then, the inverters 170 and 172 invert the output voltage of the first inverter 111 and the output voltage of the second inverter 115, respectively, and output them as output signals OUTL and OUTR.

The voltage source 116A generates a drive voltage VCC for driving the program circuit 100. The voltage source 116A may preferably be connected to substrate potentials of all of the p-type MOS transistors except the sources of the p-type MOS transistors 132 and 142 of the rewriting circuit 130, the gate of the p-type MOS transistor 140, the power supply sections of the inverters 168, 170 and 172 of the data input/output circuit 160, the gate of the p-type MOS transistor 140, the power-on reset circuit 200 and the p-type MOS transistors 112 and 116, and supplies the drive voltage VCC to them. The drive voltage VCC is a voltage that drives the ferroelectric memory device 500 (see FIG. 1), and its voltage value gradually elevates from the ground voltage (0V) when the ferroelectric memory device 500 or the program circuit 100 is started.

Figure 3:
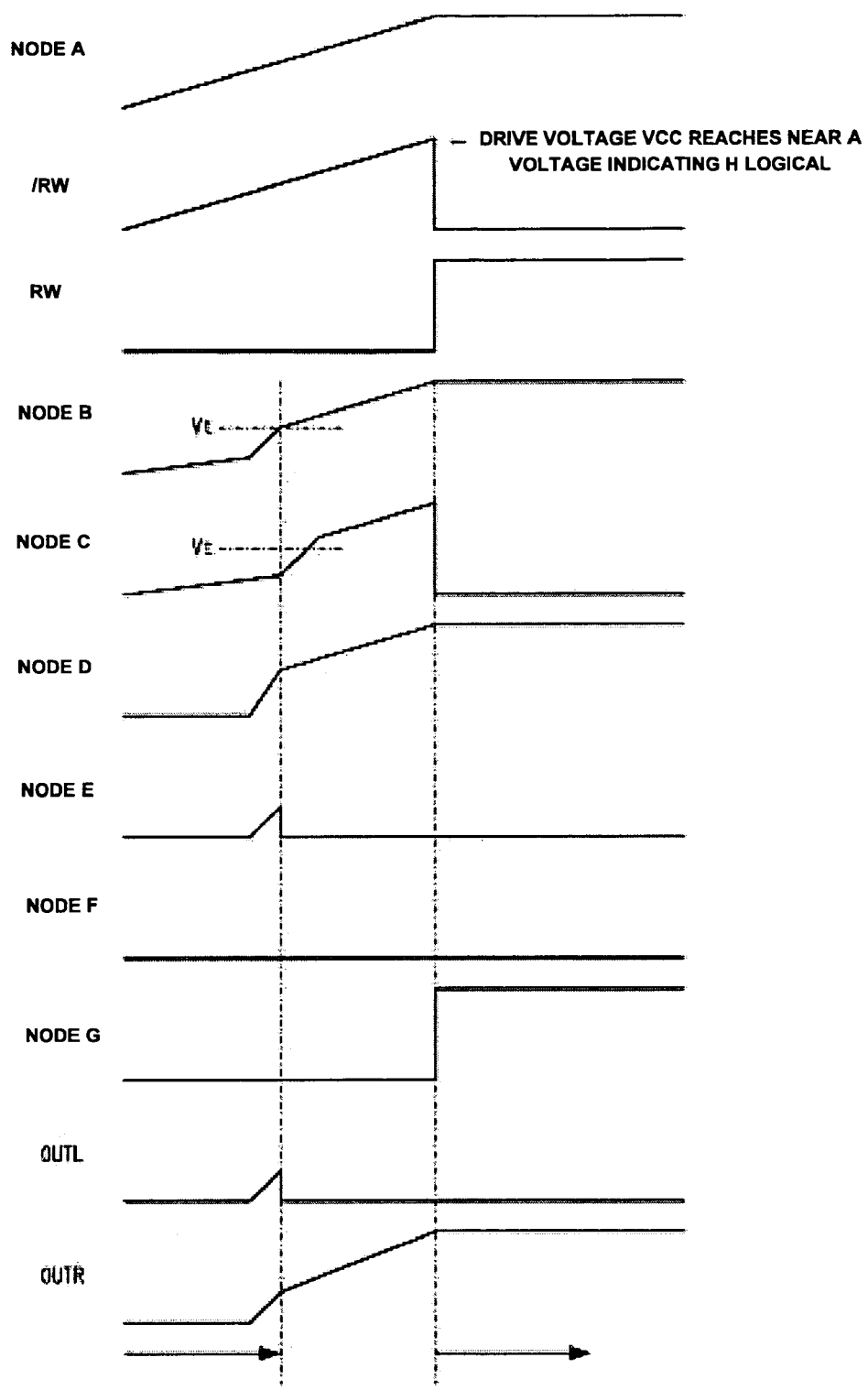
FIG. 3 is a timing chart showing operations of the program circuit 100.

FIG. 3 is a timing chart showing operations of the program circuit 100. Referring to FIG. 2 and FIG. 3, the operations of the program circuit 100 of the present embodiment are described. In the example below, the operations of the program circuit 100 are described as to an example where the first ferroelectric capacitor 122 stores data "0," and the second ferroelectric capacitor 124 stores data "1."

First, when the program circuit 100 is powered on, the voltage source 116A starts generating a drive voltage VCC, and the voltage at the node A, which is an output of the voltage source 116A, gradually rises. At the same time, the potential of an output /RW from the power-on reset circuit 200 rises. It is noted here that, because the n-type MOS transistors 138 and 148 turn on, the other ends (nodes F and G) of the first ferroelectric capacitor 122 and the second ferroelectric capacitor 124 are at the ground potential, respectively, and therefore the p-type MOS transistors 132 and 134 are turned on, such that the drive voltage VCC generated by the voltage source 116A is supplied to the sources of the p-type MOS transistors 112 and 116 through the p-type MOS transistors 132 and 142, which are examples of resistance elements. In other words, the voltages on the sources of the p-type MOS transistors 112 and 116, in other words, the voltages at the node B and C rise. It is noted here that, because the first ferroelectric capacitor 122 connected to the node B stores data "0," and the second ferroelectric capacitor 124 connected to the node C stores data "1," a greater paraelectric capacitance is given to the node C than to the node B. Accordingly, the voltage at the node B rises more quickly than the voltage at the node C.

When the voltage at the node B reaches the threshold voltage Vt of each of the MOS transistors composing the first inverter 111 and the second inverter 115, and as the voltage at the node C has not yet reached the threshold voltage Vt at this moment, the n-type MOS transistor 118 turns on, and the p-type MOS transistor 116 turns off. In other words, the output voltage of the second inverter 115, in other words, the voltage at the node E is set to be the ground voltage.

When the output voltage of the second inverter 115 becomes to be the ground voltage, the n-type MOS transistor 114 turns off, and the p-type MOS transistor 112 turns on, such that the output voltage of the first inverter 115, in other words, the voltage at the node D becomes to be generally the same voltage as the drive voltage VCC. By this, the latch circuit 110 fixes the voltage at the node D to the drive voltage VCC and the voltage at the node E to the ground voltage, and the latch circuit 110 retains data read from the first ferroelectric capacitor 122 and the second ferroelectric capacitor 124. Then, the input/output circuit 160 outputs the ground voltage as an output signal OUTL, and outputs the drive voltage VCC as an output signal OUTR. It is noted that the voltage of the output signal OUTR rises as the drive voltage VCC rises.

Next, when the voltage value of the drive voltage VCC generated by the voltage source 116A reaches about a voltage indicating H logical, the power-on reset circuit 200 sets the signal /RW to L logical, and the signal RW to H logical.

By this, the n-type MOS transistors 138 and 148 that are grounding the nodes F and G turn off, and the transfer gates 134 and 144 turn on, such that the node F is connected to the output of the second inverter 115, and the node G is connected to the output of the first inverter 111. In other words, the voltage at the node F become the ground voltage, and the voltage at the node G becomes the drive voltage VCC.

As the voltage at the node F remains to be the ground voltage, and the p-type MOS transistor 132 thus remains to be on, the voltage at the one end of the first ferroelectric capacitor 122 becomes to be the drive voltage VCC. On the other hand, because the voltage at the other end of the first ferroelectric capacitor 122 is the ground voltage, a voltage −VCC is applied to the first ferroelectric capacitor 122 with its one end being as reference. By this, data "0" is rewritten in the first ferroelectric capacitor 122.

On the other hand, when the voltage at the node G becomes the drive voltage VCC, the p-type MOS transistor 142 turns off, and the n-type MOS transistor 146 turns on, such that the voltage at the node C, in other words, the voltage at the one end of the second ferroelectric capacitor 124 becomes the ground voltage. On the other had, because the voltage at the other end of the second ferroelectric capacitor 124 is the drive voltage VCC, a voltage VCC is applied to the second ferroelectric capacitor 124 with its one end being as reference. By this, data "1" is rewritten in the second ferroelectric capacitor 124.

As described above, when the program circuit 100 is powered on, data stored in the first ferroelectric capacitor 122 and the second ferroelectric capacitor 124 are read out onto the latch circuit 110 and retained there, and the same data are rewritten in the first ferroelectric capacitor 122 and the second ferroelectric capacitor 124.

Figure 4:
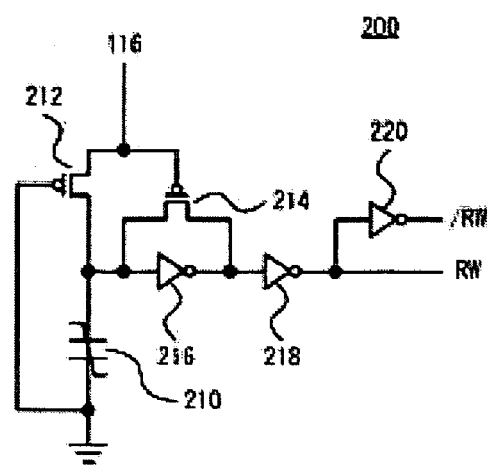
FIG. 4 is a diagram showing an example of the structure of a power-on reset circuit 200.

FIG. 4 is a diagram showing another example of the structure of the power-on reset circuit 200. The power-on reset circuit 200 includes a ferroelectric capacitor 210, p-type MOS transistors 212 and 214, and inverters 216, 218 and 220.

The ferroelectric capacitor 210 has one end to which a drive voltage VCC is supplied through the p-type MOS transistor 212, and another end that is grounded. The ferroelectric capacitor 210 is formed to have an area greater than that of the first ferroelectric capacitor 122 or the second ferroelectric capacitor 124 of FIG. 2. In other words, the paraelectric capacitance of the ferroelectric capacitor 210 is greater than the paraelectric capacitance of the first ferroelectric capacitor 122 or the second ferroelectric capacitor 124.

The p-type MOS transistor 212 functions as a resistance element, and may preferably have a capacity equal to or lower than that of the p-type MOS transistor 132 or 142 of the rewriting circuit 130. Also, the p-type MOS transistor 212 may preferably have a resistance value generally equal to or greater than the resistance value of the p-type MOS transistor 132 or 142.

The inverters 216 and 218 are connected in series to the one end of the ferroelectric capacitor 210. In other words, the node that charges the one end of the ferroelectric capacitor 210 defines an input of the inverter 216. Also, an input and an output of the inverter 216 are connected to each other through the p-type MOS transistor 214, and the p-type MOS transistor 214 short-circuits the input and the output of the inverter 216 based on a voltage value of the drive voltage VCC supplied to its gate. In other words, before driving by the voltage source, the nodes are short-circuited to stabilize the operation, and the short-circuited state is released when the operation starts. Then, the power-on reset circuit 200 outputs an output of the inverter 218 as a signal RW, and outputs its inverted signal that is inverted by the inverter 220, as a signal /RW.

By the structure described above, the timing at which the output of the power-on reset circuit 200 changes can be optimally adjusted. More concretely, by making the capacitance of the ferroelectric capacitor 210 greater and making the resistance value of the p-type MOS transistor 212 that also functions as a resistance element greater, a reset signal can be outputted after the operation of the latch circuit 110 has been determined. Also, by optimizing the size of the aforementioned capacitance and resistance value, the timing to output a reset signal can be set to a moment immediately after the operation of the latch circuit 110 has been determined.

Figure 5:
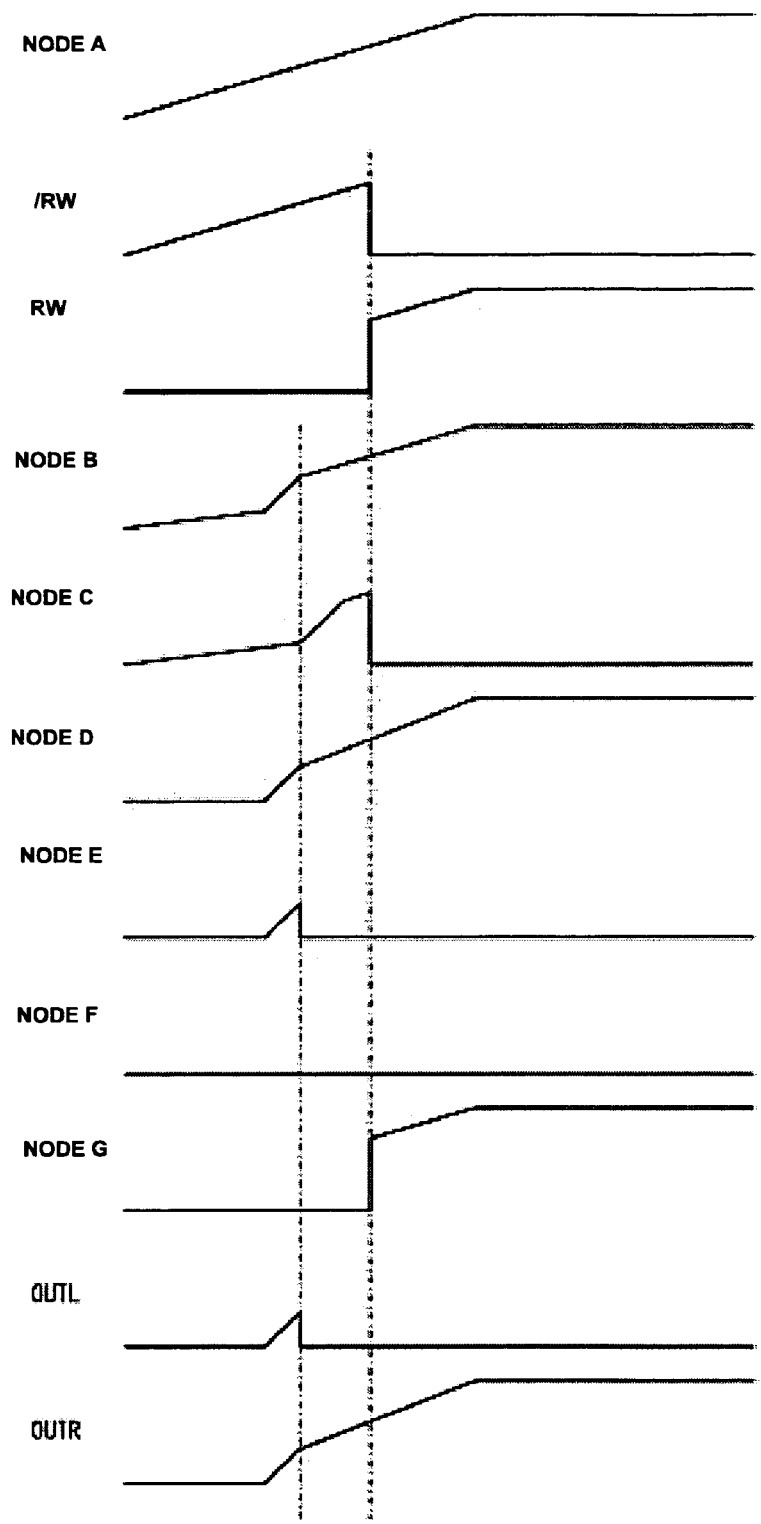
FIG. 5 is a timing chart showing operations of the program circuit 100 that uses the power-on reset circuit 200 shown in FIG. 4.

FIG. 5 is a timing chart indicating operations of the program circuit 100 that uses the power-on reset circuit 200 shown in FIG. 4. The program circuit 100 of the present example operates in a manner similar to the program circuit 100 shown in FIG. 2. However, with the power-on reset circuit 200 of the present example, because the voltage of the signal /RW becomes the ground voltage immediately after data has been read from the first ferroelectric capacitor 122 and the second ferroelectric capacitor 124, a rewriting operation is performed immediately after the reading operation has been performed. Accordingly, even when the program circuit 100 is started, and the power supply is interrupted while the power level is rising, destruction of data in the first ferroelectric capacitor 122 and the second ferroelectric capacitor 124 can be prevented.

Furthermore, by using the power-on reset circuit shown in FIG. 4, an optimum power-on reset circuit exclusively used for the present embodiment can be realized with a very simple structure without using a complex power-on reset circuit that has been generally used in semiconductor integrated circuits.

In the present embodiment, when the drive voltage is supplied to the latch circuit 110, in other words, when the program circuit 100 is powered on, or when the semiconductor device is powered on, the voltages on the power supply terminal of the first inverter 111 and the power supply terminal of the second inverter 115 rise according to the first capacitance and the second capacitance. In other words, the voltage on each of the power supply terminals rise according to the paraelectric characteristic of each of the first ferroelectric capacitor 122 and the second ferroelectric capacitor 124. Accordingly, in accordance with the present embodiment, the rising rates of output voltages of the first inverter 111 and the second inverter 115 are determined by the first capacitance and the second capacitance, which makes it possible to provide a program circuit 100 that can read out data stored in the first ferroelectric capacitor 122 and the second ferroelectric capacitor 124 onto the latch circuit 110 merely by powering on the semiconductor device.

In accordance with the present embodiment, the power supply terminal of the first inverter 111 and the power supply terminal of the second inverter 115, and the first ferroelectric capacitor 122 and the second ferroelectric capacitor 124 connected thereto are charged through the resistance elements. Therefore, in accordance with the present embodiment, data stored in the first ferroelectric capacitor 122 and the second ferroelectric capacitor 124 are stably read out onto the latch circuit 110.

In accordance with the present embodiment, the rewriting circuit 130 rewrites data in the first ferroelectric capacitor 122 and the second ferroelectric capacitor 124 based on data retained by the latch circuit 110. Also, in accordance with the present embodiment, the rewriting circuit 130 performs a rewriting operation according to the timing at which the voltage source 116A supplies a drive voltage to the power supply terminals. Therefore, in accordance with the present embodiment, it is possible to provide a program circuit 100 that can rewrite data in the first ferroelectric capacitor 122 and the second ferroelectric capacitor 124 with a very simple structure.

In accordance with the present embodiment, merely by powering on, the rewriting circuit 130 can perform a rewriting operation, while controlling voltages to be applied to the first ferroelectric capacitor 122 and the second ferroelectric capacitor 124.

The embodiment examples and application examples described above with reference to the embodiment of the present invention may be appropriately combined depending on the usages, or may be used with changes and/or improvements added thereto. The invention is not limited to the descriptions of the embodiments above. It is clear from the description in the scope of patent claims that modes created by such combinations, changes and/or improvements can be included in the technical scope of the invention.

What is claimed is:

1. A memory circuit comprising:
a latch circuit having a first inverter and a second inverter;
a first ferroelectric capacitor that gives a first capacitance to a power supply terminal of the first inverter;
a second ferroelectric capacitor that gives a second capacitance different from the first capacitance to a power supply terminal of the second inverter; and
a voltage source that starts supplying a drive voltage for driving the latch circuit to the power supply terminal of the first inverter to which the first capacitance is given and the power supply terminal of the second inverter to which the second capacitance is given,
wherein a first end of the first ferroelectric capacitor is connected to the power supply terminal of the first inverter, a first end of the second ferroelectric capacitor is connected to the power supply terminal of the second inverter, and the voltage source is connected to each of the power supply terminals and each of the first ends.

2. A memory circuit comprising:
a latch circuit having a first inverter and a second inverter;
a first ferroelectric capacitor that gives a first capacitance to a power supply terminal of the first inverter;
a second ferroelectric capacitor that gives a second capacitance different from the first capacitance to a power supply terminal of the second inverter;
a voltage source that starts supplying a drive voltage for driving the latch circuit to the power supply terminal of the first inverter to which the first capacitance is given and the power supply terminal of the second inverter to which the second capacitance is given; and
a resistance element provided between the power supply terminal of the first inverter and the power supply terminal of the second inverter.

3. A memory circuit according to claim 2, wherein the resistance element is a p-type MOS transistor.

4. A memory circuit comprising:
a latch circuit having a first inverter and a second inverter;
a first ferroelectric capacitor that gives a first capacitance to a power supply terminal of the first inverter;
a second ferroelectric capacitor that gives a second capacitance different from the first capacitance to a power supply terminal of the second inverter;
a voltage source that starts supplying a drive voltage for driving the latch circuit to the power supply terminal of the first inverter to which the first capacitance is given and the power supply terminal of the second inverter to which the second capacitance is given,
wherein the first ferroelectric capacitor stores first data, and the second ferroelectric capacitor stores second data complementary to the first data, and
further comprising a rewriting circuit that, when the voltage source supplies the drive voltage to the power supply terminal of the first inverter and the power supply terminal of the second inverter, stores the second data in the second ferroelectric capacitor based on an output of the first inverter and the first data in the first ferroelectric capacitor based on an output of the second inverter.

5. A memory circuit according to claim 4, wherein each of the first ferroelectric capacitor and the second ferroelectric capacitor has one end and another end, and
the rewriting circuit has a first p-type MOS transistor having a source connected to the voltage source and a drain connected to the power supply terminal of the first inverter and to the one end of the first ferroelectric capacitor, and
a second p-type MOS transistor having a source connected to the voltage source and a drain connected to the power supply terminal of the second inverter and to the one end of the second ferroelectric capacitor,
wherein, based on an output of the second inverter, a ground voltage or the output of the second inverter is supplied to a gate of the first p-type MOS transistor and the other end of the first ferroelectric capacitor, and based on an output of the first inverter, a ground voltage or the output of the first inverter is supplied to a gate of the second p-type MOS transistor and the other end of the second ferroelectric capacitor.

6. A memory circuit according to claim 5, wherein the rewriting circuit has a first n-type MOS transistor having a source grounded, a drain connected to the power supply terminal of the first inverter and to the one end of the first ferroelectric capacitor and a gate connected to the other end of the first ferroelectric capacitor, and a second n-type MOS transistor having a source grounded, a drain connected to the power supply terminal of the second inverter and to the one end of the second ferroelectric capacitor and a gate connected to the other end of the second ferroelectric capacitor.

7. A memory circuit according to claim 5, wherein the rewriting circuit includes a first transfer gate provided between an output terminal of the second inverter and the other end of the first ferroelectric capacitor and the gate of the first p-type MOS transistor, and a second transfer gate provided between an output terminal of the first inverter and the other end of the second ferroelectric capacitor and the gate of the second p-type MOS transistor.

8. A memory circuit according to claim 7, further comprising a voltage detecting section that, when a voltage value of the drive voltage exceeds a specified value, turns on the first transfer gate and the second transfer gate, to thereby supply an output of the first inverter to the other end of the second ferroelectric capacitor and to the gate of the second p-type MOS transistor, and supply an output of the second inverter to the other end of the first ferroelectric capacitor and to the gate of the first p-type MOS transistor.

9. A memory circuit according to claim 8, wherein the rewriting circuit has a third n-type MOS transistor having a source grounded and a drain connected to the other end of the first ferroelectric capacitor, and a fourth n-type MOS transistor having a source grounded and a drain connected to the other end of the second ferroelectric capacitor,
wherein the voltage detecting section turns on the third n-type MOS transistor and the fourth n-type MOS transistor and turn off the first transfer gate and the second transfer gate when the voltage value of the drive voltage is lower than a specified value, and turns off the third n-type MOS transistor and the fourth n-type MOS transistor when the voltage value of the drive voltage exceeds the specified value.

10. A memory device according to claim 8, wherein the voltage detecting section has a third inverter, a third ferroelectric capacitor that gives a third capacitance greater than the first capacitance and the second capacitance to an input terminal of the third inverter, and a resistance element that is provided between the voltage source and the input terminal of the third inverter and has a resistance value that is generally the same as or greater than a resistance value of the first p-type MOS transistor and the second p-type MOS transistor.

11. A semiconductor device comprising the memory circuit according to claim 1.

* * * * *